US009246040B2

(12) United States Patent
Shin et al.

(10) Patent No.: US 9,246,040 B2
(45) Date of Patent: Jan. 26, 2016

(54) THIN FILM SOLAR CELL MODULE AND METHOD FOR MANUFACTURING THE SAME

(71) Applicant: LG ELECTRONICS INC., Seoul (KR)

(72) Inventors: Junoh Shin, Seoul (KR); Huijae Lee, Seoul (KR); Sungeun Lee, Seoul (KR); Jeonghun Son, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 284 days.

(21) Appl. No.: 13/650,974

(22) Filed: Oct. 12, 2012

(65) Prior Publication Data

US 2013/0092209 A1     Apr. 18, 2013

(30) Foreign Application Priority Data

Oct. 13, 2011  (KR) .................. 10-2011-0104550

(51) Int. Cl.
*H01L 31/05*      (2014.01)
*H01L 31/076*     (2012.01)
*H01L 31/02*      (2006.01)
*H01L 31/046*     (2014.01)
*H01L 31/18*      (2006.01)

(52) U.S. Cl.
CPC ........ *H01L 31/076* (2013.01); *H01L 31/02008* (2013.01); *H01L 31/046* (2014.12); *Y02E 10/548* (2013.01)

(58) Field of Classification Search
CPC . H01L 27/1425; H01L 27/1426; H01L 31/05; H01L 27/1423
USPC ........................................................ 136/249
See application file for complete search history.

(56) References Cited

U.S. PATENT DOCUMENTS

| 6,455,347 B1* | 9/2002 | Hiraishi et al. ............. 438/80 |
| 2006/0118965 A1 | 6/2006 | Matsui |
| 2011/0036392 A1 | 2/2011 | Bi et al. |
| 2011/0197953 A1* | 8/2011 | Pfeuffer .................. 136/249 |
| 2011/0265857 A1* | 11/2011 | Wang et al. ............. 136/249 |

FOREIGN PATENT DOCUMENTS

| JP | 09083001 A * | 3/1997 | ........ H01L 31/042 |
| JP | 2006-165025 A | 6/2006 | |

(Continued)

OTHER PUBLICATIONS

Rowell et al, Transparent electrode requirements for thin film solar cell modules, 2011, The Royal Society of Chemistry, vol. 4, pp. 131-134.*

*Primary Examiner* — Jonathan Johnson
*Assistant Examiner* — Bethany L Martin
(74) *Attorney, Agent, or Firm* — Birch, Stewart, Kolasch & Birch, LLP

(57) ABSTRACT

A thin film solar cell module according to an embodiment of the invention includes a substrate, a plurality of solar cells each including a first electrode on the substrate, a second electrode on the first electrode, and a photoelectric conversion unit between the first electrode and the second electrode, a ribbon positioned on each of first and second outermost solar cells among the solar cells, and a conductive adhesive part positioned between the first outermost solar cell and the ribbon and between the second outermost solar cell and the ribbon. The conductive adhesive part positioned between the second electrode of the first outermost solar cell and the ribbon includes a first connector, which is electrically connected to the first electrode, the photoelectric conversion unit, and the second electrode of the first outermost solar cell.

15 Claims, 13 Drawing Sheets

(56) References Cited

FOREIGN PATENT DOCUMENTS

| | | |
|---|---|---|
| JP | 2009/88175 A | 4/2009 |
| JP | 2010-171127 A | 8/2010 |
| JP | 2010-211996 A | 9/2010 |
| JP | 2011-114216 A | 6/2011 |
| WO | WO 2009/139390 A1 | 11/2009 |
| WO | WO 2011/125641 A1 | 10/2011 |

* cited by examiner

THIN FILM SOLAR CELL MODULE AND METHOD FOR MANUFACTURING THE SAME

This application claims priority to and the benefit of Korean Patent Application No. 10-2011-0104550 filed in the Korean Intellectual Property Office on Oct. 13, 2011, the entire contents of which are incorporated herein by reference.

BACKGROUND OF THE INVENTION

1. Field of the Invention

Embodiments of the invention relate to a thin film solar cell module and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type, and thus, form a p-n junction, and electrodes respectively connected to the semiconductor parts of the different conductive types.

When light is incident on the solar cell, a plurality of electron-hole pairs are produced in the semiconductor parts. The electron-hole pairs are separated into electrons and holes by the photovoltaic effect. The separated electrons move to the n-type semiconductor part, and the separated holes move to the p-type semiconductor part. Then, the electrons and the holes are collected by the electrodes electrically connected to the n-type semiconductor part and the p-type semiconductor part, respectively. The electrodes are connected to each other using electric wires to thereby obtain electric power.

SUMMARY OF THE INVENTION

In one aspect, there is a thin film solar cell module including a substrate, a plurality of solar cells each including a first electrode positioned on the substrate, a second electrode positioned on the first electrode, and a photoelectric conversion unit positioned between the first electrode and the second electrode, a ribbon positioned on each of first and second outermost solar cells among the plurality of solar cells, and a conductive adhesive part positioned between the first outermost solar cell and the ribbon and between the second outermost solar cell and the ribbon, the conductive adhesive part electrically connecting each of the first and second outermost solar cells to the ribbon, wherein the conductive adhesive part positioned between the second electrode of the first outermost solar cell and the ribbon includes a first connector, which is electrically connected to the first electrode, the photoelectric conversion unit, and the second electrode included in the first outermost solar cell.

The second electrode of the first outermost solar cell may include a second connector, which passes through the photoelectric conversion unit of the first outermost solar cell and is electrically connected to the first electrode of the first outermost solar cell.

The first electrode of the first outermost solar cell may be integrally formed along with a first electrode of a solar cell directly adjacent to the first outermost solar cell.

There may be a plurality of first connectors. The plurality of first connectors may have different widths. More specifically, the widths of the plurality of first connectors may increase as the plurality of first connectors are closer to a solar cell directly adjacent to the first outermost solar cell.

There may be a plurality of second connectors. The plurality of second connectors may have different widths. More specifically, the widths of the plurality of second connectors may increase as the plurality of second connectors are closer to a solar cell directly adjacent to the first outermost solar cell.

A width of each of the first connector and the second connector is about 40 μm to 150 μm.

The conductive adhesive part may contain a metal material. The conductive adhesive part may include an adhesive resin and a plurality of conductive particles distributed in the adhesive resin.

The thin film solar cell module may further include a junction box configured to collect an electric power produced by the plurality of solar cells, and a bus bar electrode which is positioned across upper parts of the plurality of solar cells and connects the junction box to the ribbon.

The thin film solar cell module may further include an insulating part which is positioned between the plurality of solar cells and the bus bar electrode and is formed of a non-conductive material.

The photoelectric conversion unit may include at least one layer having a p-i-n structure.

The conductive adhesive part positioned between the second electrode of the second outermost solar cell and the ribbon may be electrically connected to the second electrode of the second outermost solar cell and may not be electrically connected to the first electrode and the photoelectric conversion unit of the second outermost solar cell.

The second electrode of the first outermost solar cell may be, electrically connected to a first electrode of a solar cell directly adjacent to the first outermost solar cell. The first electrode of the second outermost solar cell may be electrically connected to a second electrode of a solar cell directly adjacent to the second outermost solar cell.

The conductive adhesive part positioned between the second electrode of the first outermost solar cell and the ribbon may contact an upper surface and a lateral surface of the second electrode of the first outermost solar cell. Further, the conductive adhesive part positioned between the second electrode of the first outermost solar cell and the ribbon may contact a lateral surface of the photoelectric conversion unit of the first outermost solar cell and may contact a portion of an upper surface of the first electrode of the first outermost solar cell.

In another aspect, there is a method for manufacturing a thin film solar cell module including a plurality of solar cells, the method including forming a first electrode layer on an upper surface of a substrate, and forming a first scribing line pattern on the first electrode layer to locally expose the substrate to thereby form a plurality of first electrodes respectively included in the plurality of solar cells, forming a photoelectric conversion unit layer on upper surfaces of the plurality of first electrodes, and forming a second scribing line pattern on the photoelectric conversion unit layer to locally expose the plurality of first electrodes to thereby form a plurality of photoelectric conversion units respectively included in the plurality of solar cells, forming a second electrode layer on the plurality of photoelectric conversion units and exposed portions of the plurality of first electrodes, and forming a third scribing line pattern on the second electrode layer to locally expose the plurality of first electrodes to thereby form a plurality of second electrodes respectively included in the plurality of solar cells, and forming a separate third scribing line pattern on a second electrode of an outermost solar cell among the plurality of solar cells to locally expose a first electrode of the outermost solar cell.

The method may further include forming a separate second scribing line pattern on a photoelectric conversion unit of an outermost solar cell among the plurality of solar cells to locally expose the first electrode of the outermost solar cell.

The forming of the plurality of second electrodes may include bringing a second electrode of the outermost solar cell into contact with the first electrode of the outermost solar cell in a space formed by the separate second scribing line pattern.

The method may further include, after forming the separate third scribing line pattern, forming a conductive adhesive part on the outermost solar cell.

The forming of the conductive adhesive part may include bringing the conductive adhesive part into contact with the first electrode of the outermost solar cell.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. A detailed description of known arts will be omitted if it is determined that the known arts can obscure the embodiments of the invention.

Figure 1:
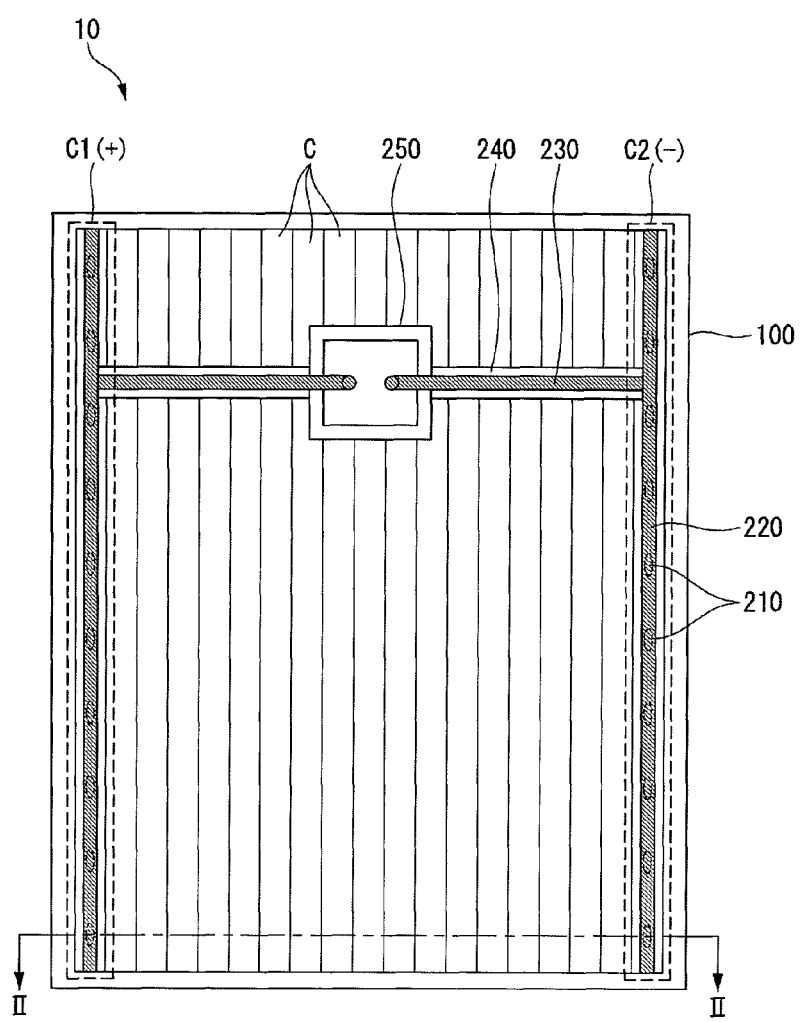
FIGS. 1 to 2C illustrate a thin film solar cell module according to an example embodiment of the invention.
Figure 2A:
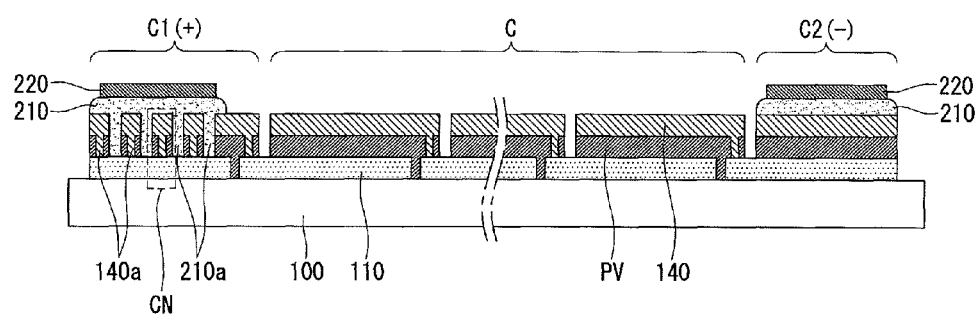
Figure 2B:
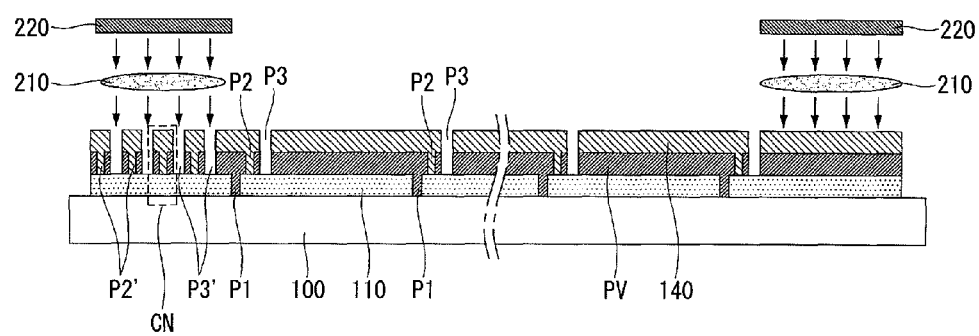
Figure 2C:
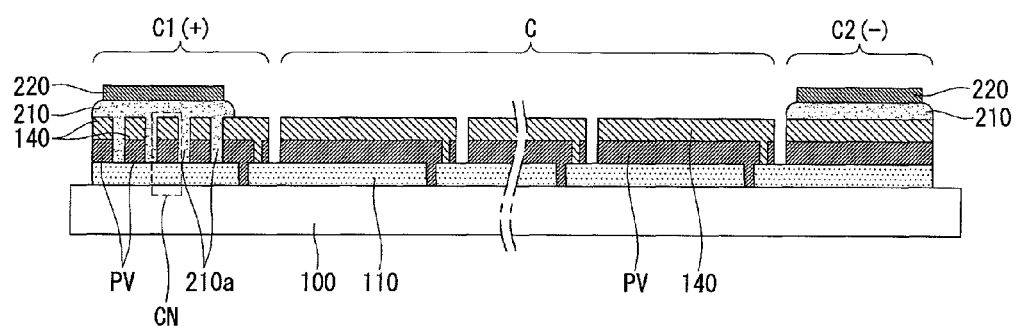

FIGS. 1 to 2C illustrate a thin film solar cell module according to an example embodiment of the invention.

More specifically, FIG. 1 is a plane view of a thin film solar cell module according to an example embodiment of the invention when viewing from a bottom surface thereof. FIG. 2A is a schematic cross-sectional view taken along line II-II of FIG. 1, and illustrates a connection relation between an outermost solar cell of the thin film solar cell module and a conductive adhesive part. FIG. 2B illustrates an example where a conductive adhesive part shown in FIGS. 1 and 2A is electrically connected to an outermost solar cell. FIG. 2C illustrates an example where a second connector is omitted in an outermost solar cell of the thin film solar cell module according to the example embodiment of the invention.

As shown in FIG. 1, a thin film solar cell module 10 according to the embodiment of the invention may include a substrate 100, a plurality of solar cells C, C1, and C2, a plurality of conductive adhesive parts 210, a ribbon 220, a bus bar electrode 230, an insulating part 240, and a junction box 250.

The insulating part 240 may be omitted, if desired or necessary.

The substrate 100 supports the solar cells C, C1, and C2 and prevents the solar cells C, C1, and C2 from being polluted from the outside. The substrate 100 may be formed of a substantially transparent material, for example, glass or plastic, so that light incident on the substrate 100 efficiently reaches a photoelectric conversion unit PV.

The plurality of solar cells C, C1, and C2 are disposed on the substrate 100. As shown in FIGS. 2A to 2C, each of the plurality of solar cells C, C1, and C2 includes a first electrode 110, a second electrode 140, and the photoelectric conversion unit PV.

The first electrode 110 is disposed on the substrate 100, and the second electrode 140 is disposed on the first electrode 110. The photoelectric conversion unit PV is positioned between the first electrode 110 and the second electrode 140 and converts light incident thereon into electricity. Various configurations of each solar cell are described in detail with reference to FIGS. 3 to 5.

As shown in FIGS. 1 to 2C, the plurality of solar cells C, C1, and C2 are distinguished from one another by a plurality of scribing lines P1, P2, and P3 shown in a vertical direction of a thin film solar cell.

More specifically, as shown in FIG. 2A, the first electrodes 110 of the solar cells C, C1, and C2 are distinguished from one another by the first scribing line P1, and the photoelectric conversion units PV of the solar cells C, C1, and C2 are distinguished from one another by the second and third scribing lines P2 and P3. Further, the second electrodes 140 of the solar cells C, C1, and C2 are distinguished from one another by the third scribing line P3.

An etching process on the first electrodes 110, the photoelectric conversion units PV, and the second electrodes 140 of the solar cells C, C1, and C2 based on patterns of the first, second, and third scribing lines P1, P2, and P3 may be performed using a laser beam.

A method for forming the solar cells C, C1, and C2 included in the solar cell module 10 is briefly described below.

First, the first electrode 110 is formed on the entire upper surface of the substrate 100. Then, the first electrode 110 is partially (or locally) removed based on the pattern of the first scribing line P1 to form first electrodes 110 respectively included in the plurality of solar cells.

Next, the photoelectric conversion unit PV is formed on the entire upper surfaces of the first electrodes 110. Then, the photoelectric conversion unit PV is partially (or locally) removed based on the pattern of the second scribing line P2 to form photoelectric conversion units PV respectively included in the plurality of solar cells.

Finally, the second electrode 140 is formed on the entire upper surfaces of the photoelectric conversion units PV. In this instance, the second electrode 140 of each solar cell is electrically connected to the first electrode 110 of another solar cell (adjacent to the one solar cell) exposed by the pattern of the second scribing line P2. Further, each of the second electrode 140 and the photoelectric conversion unit PV is partially (or locally) removed based on the pattern of the third scribing line P3 to form second electrodes 140 respectively included in the plurality of solar cells. Hence, as shown in FIG. 2A, the plurality of solar cells of the thin film solar cell module are obtained.

Accordingly, the second electrode 140 of the first outermost solar cell C1 is electrically connected to the first electrode 110 of the solar cell adjacent to the first outermost solar cell C1, and the first electrode 110 of the second outermost solar cell C2 is electrically connected to the second electrode 140 of the solar cell adjacent to the second outermost solar cell C2. Hence, the solar cells C, C1, and C2 included in the solar cell module 10 are electrically connected in series to one another.

The second electrode 140 included in one, of the two outermost solar cells of the plurality of solar cells C, C1, and C2 has a positive (+) polarity, and the second electrode 140 included in the other outermost solar cell has a negative (−) polarity.

For example, as shown in FIGS. 1 and 2A, the second electrode 140 of the first outermost solar cell C1 may have a positive (+) polarity, and the second electrode 140 of the second outermost solar cell C2 may have a negative (−) polarity.

More specifically, as shown in FIG. 2A, the photoelectric conversion unit PV of the first outermost solar cell C1 cannot perform its original functions because the first electrode 110 and the second electrode 140 of the first outermost solar cell C1 are electrically connected to each other. Thus, the first outermost solar cell C1 of the thin film solar cell module according to the embodiment of the invention may include a plurality of non-power generation cells CN.

As described above, each of the plurality of non-power generation cells CN can hardly perform a photoelectric conversion function, because the first electrode 110 and the second electrode 140 of the first outermost solar cell C1 are electrically connected to each other.

The ribbon 220 may be disposed on the second electrode 140 of each of the first and second outermost solar cells C1 and C2. The ribbon 220 may contain a conductive material.

The first electrode 110 of the second outermost solar cell C2 is electrically connected to the second electrode 140 of the solar cell adjacent to the second outermost solar cell C2, and the second electrode 140 of the second outermost solar cell C2 is electrically connected to the junction box 250 through the conductive adhesive part 210 and the ribbon 220. Hence, a closed circuit of the thin film solar cell module 10 is configured. The photoelectric conversion unit PV of the second outermost solar cell C2 performs a photoelectric conversion function. Hence, the first electrode 110 of the second outermost solar cell C2 collects carriers (for example, holes), and the second electrode 140 of the second outermost solar cell C2 collects carriers (for example, electrons), and thus, has the negative (−) polarity.

The polarity of the second electrode 140 of the first outermost solar cell C1 and the polarity of the second electrode 140 of the second outermost solar cell C2 vary depending on the material and the structure of the photoelectric conversion units PV included in the thin film solar cell module 10 according to the embodiment of the invention. The polarities are not limited to those described in the embodiment of the invention.

In the thin film solar cell module 10 according to the embodiment of the invention, when the photoelectric conversion unit PV is partially (or locally) removed based on the pattern of the second scribing line P2, a portion of the photoelectric conversion unit PV to be included in the first outermost solar cell C1 is additionally removed based on a pattern of a separate second scribing line P2'.

Further, when each of the second electrode 140 and the photoelectric conversion unit PV is partially (or locally) removed based on the pattern of the third scribing line P3, a portion of each of the second electrode 140 and the photoelectric conversion unit PV to be included in the first outermost solar cell C1 is additionally removed based on a pattern of a separate third scribing line P3'.

As described above, a reason to perform the etching process on the first outermost solar cell C1 based on the patterns of the separate second and third scribing lines P2' and P3' is to increase an contact strength between the conductive adhesive part 210 and the first outermost solar cell C1 to thereby reduce a contact resistance between the conductive adhesive part 210 and the first outermost solar cell C1. This will be described in detail later.

As shown in FIGS. 1 to 2C, the ribbon 220 is disposed on both the outermost solar cells C1 and C2 among the plurality of solar cells C, C1, and C2. More specifically, the ribbon 220 is disposed on the second electrodes 140 of the first and second outermost solar cells C1 and C2, and thus, is electrically connected to the second electrode 140 of each of the first and second outermost solar cells C1 and C2.

The ribbon 220 receives the electric current that is converted from (or generated by) light at the first and second outermost solar cells C1 and C2 among the plurality of solar cells C, C1, and C2, through the conductive adhesive parts 210 electrically contacting the second electrodes 140 formed on the back surfaces of the outermost solar cells C1 and C2. Then, the ribbon 220 transfers the electric current to the bus bar electrode 230, so as to enable the electric current to flow to the junction box 250.

The plurality of conductive adhesive parts 210 are formed between each of the first and second outermost solar cells C1 and C2 and the ribbon 220 to thereby electrically connect each of the outermost solar cells C1 and C2 to the ribbon 220. More specifically, as shown in FIGS. 2A to 2C, the plurality of conductive adhesive parts 210 are respectively formed between each of the outermost solar cells C1 and C2 and the ribbon 220 and electrically connect the outermost solar cells C1 and C2 to the ribbon 220, thereby reducing a contact resistance between each of the outermost solar cells C1 and C2 and the ribbon 220.

The conductive adhesive parts 210 may contain a metal material with electrical conductivity, for example, silver (Ag) or lead (Pb). Silver (Ag) used in the conductive adhesive parts 210 has good electrical conductivity and may reduce a damage of the outermost solar cells C1 and C2 when the conductive adhesive parts 210 containing silver (Ag) are attached to the outermost solar cells C1 and C2.

In a method for forming the conductive adhesive parts 210, an Ag paste containing silver (Ag) is coated on the second electrode 140 of each of the outermost solar cells C1 and C2 at locations to form the conductive adhesive part 210 at intervals, which may or may not be uniform.

Next, the ribbon 220 is disposed on each of the outermost solar cells C1 and C2, on which the Ag paste is coated, and then heat and pressure are properly applied to the ribbon 220. Hence, the Ag paste is hardened to form the conductive adhesive part 210 for electrically connecting the second electrode 140 of each of the outermost solar cells C1 and C2 to the ribbon 220.

Alternatively, the conductive adhesive part 210 may be formed as a conductive film. More specifically, the conductive adhesive part 210 may include an adhesive resin and a plurality of conductive particles distributed in the adhesive resin in a film form. The conductive particles may be distributed in the adhesive resin when there is no external pressure, and may physically contact each other when external pressure is applied.

In the embodiment of the invention, the conductive particles may be metal particles, for example, Ni particles, and the adhesive resin may be an epoxy resin or an acrylic resin.

When the conductive adhesive part 210 is formed as the conductive film, the conductive adhesive part 210 may be formed at a temperature lower than when the conductive adhesive part 210 is formed using the paste containing the metal material with electrical conductivity. Hence, a reduction in efficiency of the solar cell resulting from a high temperature may be prevented.

More specifically, a process temperature of the conductive adhesive part 210 formed using the paste containing the metal material with electrical conductivity may be equal to or higher than about 200° C., and a process temperature of the conductive adhesive part 210 formed using the conductive film may be equal to or lower than about 180° C. Therefore, a damage of the solar cell resulting from the high temperature in a tabbing process may be prevented or reduced.

The junction box 250 collects electric power produced by the plurality of solar cells C, C1, and C2, and is connected to the ribbon 220 by the bus bar electrode 230 positioned across upper parts of the plurality of solar cells C, C1, and C2.

The bus bar electrode 200 is positioned across the upper parts of the plurality of solar cells C, C1, and C2 and connects the junction box 250 to the ribbon 220.

The insulating part 240 is formed of a non-conductive material and is disposed between the bus bar electrode 230 and the second electrodes 140 of the plurality of solar cells C excluding the outermost solar cells C1 and C2 from the plurality of solar cells C, C1, and C2. The insulating part 240 provides insulation between the bus bar electrode 230 positioned across the upper parts of the plurality of solar cells C and the second electrodes 140 of the plurality of solar cells C.

The insulating part 240 may be formed of a synthetic resin material. For example, the insulating part 240 may be formed of ethylene vinyl acetate (EVA), polyvinyl butyral, ethylene vinyl acetate partial oxide, silicon resin, ester-based resin, olefin-based resin, etc. A width of the insulating part 240 may be greater than a width of the bus bar electrode 230.

Further, a thickness of the insulating part 240 may be almost equal to a thickness of the ribbon 220.

As shown in FIG. 2A, the conductive adhesive part 210 positioned between the first electrode 110 of the first outermost solar cell C1 and the ribbon 220 passes through the second electrode 140 and the photoelectric conversion unit PV of the first outermost solar cell C1 and is electrically connected to the first electrode 110 of the first outermost solar cell C1. The conductive adhesive part 210 positioned between the second electrode 140 of the second outermost solar cell C2 and the ribbon 220 is electrically connected to the second electrode 140 of the second outermost solar cell C2 and may not directly contact the first electrode 110 and the photoelectric conversion unit PV of the second outermost solar cell C2.

More specifically, as shown in FIGS. 1 and 2A, the conductive adhesive part 210 is attached to each of the first and second outermost solar cells C1 and C2, on which the ribbon 220 is disposed.

As shown in FIG. 2A, the conductive adhesive part 210 of the first outermost solar cell C1 includes a plurality of first connectors 210a, each of which passes through the second electrode 140 and the photoelectric conversion unit PV of the first outermost solar cell C1 and is electrically connected to the first electrode 110 of the first outermost solar cell C1.

Hence, the conductive adhesive part 210 is electrically connected to the first electrode 110, the photoelectric conversion unit PV, and the second electrode 140 of the first outermost solar cell C1.

More specifically, the conductive adhesive part 210 positioned between the first electrode 110 of the first outermost solar cell C1 and the ribbon 220 may contact an upper surface and a lateral surface of the second electrode 140 of the first outermost solar cell C1. Further, the conductive adhesive part 210 may contact a lateral surface of the photoelectric conversion unit PV of the first outermost solar cell C1 and a portion of the upper surface of the second electrode 140 of the first outermost solar cell C1.

FIG. 2A shows the plurality of first connectors 210a, for example. However, the conductive adhesive part 210 may include only one first connector 210a.

As shown in FIG. 2B, when the second electrode 140 and the photoelectric conversion unit PV of the first outermost solar cell C1 are partially (or locally) removed based on the pattern of the third scribing line P3, the etching process is additionally performed on the first outermost solar cell C1 based on the pattern of the separate third scribing line P3'. Hence, a paste for forming the conductive adhesive part 210 flows into a removed portion of each of the second electrode 140 and the photoelectric conversion unit PV of the first outermost solar cell C1 to form the first connectors 210a of the conductive adhesive part 210.

In the thin film solar cell module 10 shown in FIG. 2A, the photoelectric conversion unit PV of the first outermost solar cell C1 cannot perform the photoelectric conversion function, and the photoelectric conversion unit PV of the second outermost solar cell C2 can perform the photoelectric conversion function. Therefore, the first outermost solar cell C1 having the positive (+) polarity includes the first connectors 210a, and the second outermost solar cell C2 having the negative (−) polarity does not include the first connector 210a.

However, the embodiment of the invention is not limited thereto. For example, the second outermost solar cell C2 performing the photoelectric conversion function may include the first connector 210a in consideration of the contact resistance between the conductive adhesive part 210 and the second outermost solar cell C2 and a contribution amount of the second outermost solar cell C2 to the entire power generation efficiency of the thin film solar cell module 10.

Further, the second electrode 140 of the first outermost solar cell C1 may pass through the photoelectric conversion unit PV of the first outermost solar cell C1 and then may be electrically connected to the first electrode 110 of the first outermost solar cell C1.

In other words, as shown in FIG. 2A, the second electrode 140 of the first outermost solar cell C1 may include a plurality of second connectors 140a electrically connected to the first electrode 110 of the first outermost solar cell C1. FIG. 2A shows the plurality of second connectors 140a, for example. However, the second electrode 140 of the first outermost solar cell C1 may include only one second connector 140a.

As shown in FIG. 2B, when a portion of the photoelectric conversion unit PV of the first outermost solar cell C1 is removed based on the pattern of the second scribing line P2, the etching process is additionally performed on the first outermost solar cell C1 based on the pattern of the separate second scribing line P2'. Hence, the second connector 140a is formed in a removed portion of the photoelectric conversion unit PV of the first outermost solar cell C1.

As described above, the conductive adhesive part 210 passes through the second electrode 140 and the photoelectric conversion unit PV of the first outermost solar cell C1 and is electrically connected to the first electrode 110 of the first outermost solar cell C1. Further, the second electrode 140 of the first outermost solar cell C1 passes through the photoelectric conversion unit PV of the first outermost solar cell C1 and is electrically connected to the first electrode 110 of the first outermost solar cell C1. Hence, the contact resistance between the conductive adhesive part 210 and the first outermost solar cell C1 may decrease.

More specifically, the plurality of solar cells C, C1, and C2 of the thin film solar cell module 10 are electrically connected in series to one another. The first and second outermost solar cells C1 and C2 positioned at both ends of the plurality of solar cells C, C1, and C2 have the positive (+) polarity and the negative (−) polarity, respectively.

The first and second outermost solar cells C1 and C2 collect carriers (electrons or holes), and the collected carriers are collected by a current collector electrode through the conductive adhesive part 210 and the ribbon 220.

In this instance, because the carriers collected by the first outermost solar cell C1 are transferred to the ribbon 220 through the conductive adhesive part 210, the carriers are mainly collected between the first outermost solar cell C1 and the conductive adhesive part 210.

Hence, the contact resistance between the first outermost solar cell C1 and the conductive adhesive part 210 may be relatively high. Further, relatively high heat is generated in a contact portion between the first outermost solar cell C1 and the conductive adhesive part 210 due to the movement of carriers.

More specifically, when the thin film solar cell module is driven or in operation, a temperature of a formation area (i.e., an edge of the thin film solar cell module) of the first outermost solar cell C1 is higher than other area of the thin film solar cell module by about 10° C.

An increase in the temperature of the edge of the thin film solar cell module adversely affects the components (for example, the insulating part 240 formed of EVA or a protective sheet) positioned close to the edge of the thin film solar cell module, thereby accelerating the function reduction (or degradation) of the components. As a result, life span, of the thin film solar cell module is reduced.

However, in the embodiment of the invention, the conductive adhesive part 210 electrically connected to the first outermost solar cell C1 passes through the second electrode 140 and the photoelectric conversion unit PV of the first outermost solar cell C1 and is electrically connected to the first electrode 110 of the first outermost solar cell C1. Hence, an electrical connection portion between the first outermost solar cell C1 and the conductive adhesive part 210 extends to the upper surface and the lateral surface of the second electrode 140 of the first outermost solar cell C1 and is electrically connected to the first electrode 110 of the first outermost solar cell C1. As a result, the electrical resistance between the first outermost solar cell C1 and the conductive adhesive part 210 may be reduced, and an excessive increase in the temperature of the edge of the thin film solar cell module 10 may be prevented.

Thus, the durability of the thin film solar cell module 10 may be further improved, and the life span of the thin film solar cell module 10 may increase.

Further, in the embodiment of the invention, the second electrode 140 of the first outermost solar cell C1 passes through the photoelectric conversion unit PV of the first outermost solar cell C1 and is electrically connected to the first electrode 110 of the first outermost solar cell C1. Hence, a roundabout path (or alternative paths) of carriers from the solar cell adjacent to the first outermost solar cell C1 is provided. As a result, the electrical resistance between the first outermost solar cell C1 and the conductive adhesive part 210 may be reduced, and an excessive increase in the temperature of the edge of the thin film solar cell module 10 may be prevented.

So far, the embodiment of the invention was described with both the first and second connectors 210a and 140a as being formed in the first outermost solar cell C1. However, as shown in FIG. 2C, only the first connector 210a may be formed in the first outermost solar cell C1.

As described above, when the second connector 140a is omitted in the first outermost solar cell C1, as shown in FIG. 2C, the etching based on the pattern of the separate second scribing line P2' does not need to be performed on the first outermost solar cell C1 in a process for manufacturing the thin film solar cell module 10. Hence, the process for manufacturing the thin film solar cell module 10 may be further simplified.

So far, the embodiment of the invention was described with both the first and second connectors 210a and 140a as being formed in the first outermost solar cell C1 among the first and second outermost solar cells C1 and C2. Hereinafter, an example where the first and second connectors 210a and 140a are formed in the second outermost solar cell C2 is described with reference to FIG. 6.

Before describing this, a structure of each of the solar cells of the thin film solar cell module 10 is described below with reference to FIGS. 3 to 5.

Figure 3:
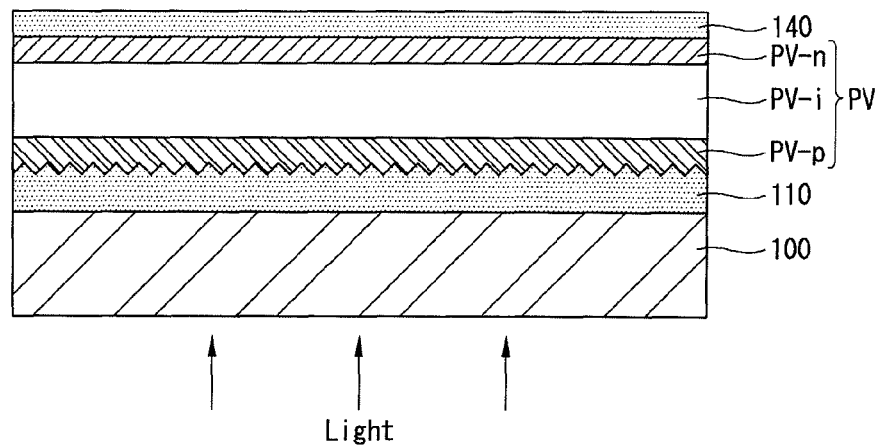
FIGS. 3 to 5 illustrate in detail one of a plurality of solar cells included in a thin film solar cell module shown in FIG. 1.
Figure 4:
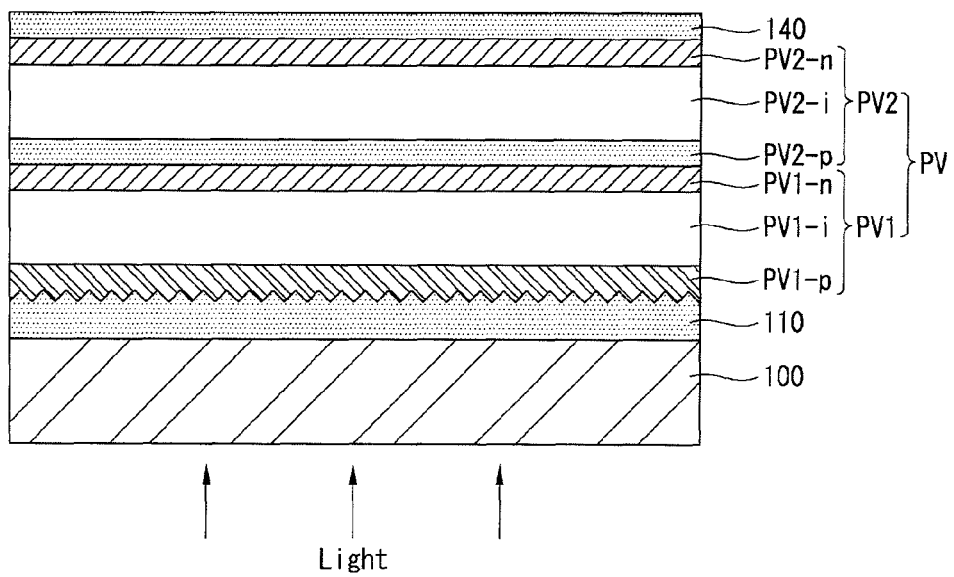
Figure 5:
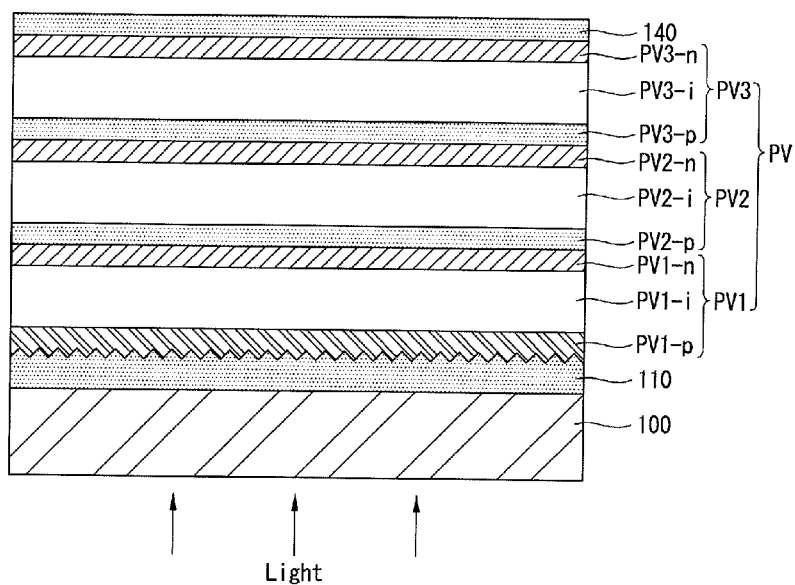

FIGS. 3 to 5 illustrate in detail one of the plurality of solar cells included in the thin film solar cell module 10 shown in FIG. 1.

As shown in FIG. 3, the solar cell may have a p-i-n single-layered structure in the embodiment of the invention.

FIG. 3 illustrates the photoelectric conversion unit PV having the p-i-n structure based on an incident surface of the substrate 100. Additionally, the photoelectric conversion unit PV may have an n-i-p structure based on the incident surface of the substrate 100. In the following description, the photoelectric conversion unit PV having the p-i-n structure based on the incident surface of the substrate 100 is taken as an example for the sake of brevity.

As shown in FIG. 3, the solar cell may include the substrate 100, the first electrode 110 positioned on the substrate 100, the second electrode 140, and the photoelectric conversion unit PV having the p-i-n single-layered structure.

The first electrode 110 is positioned on the substrate 100. The first electrode 110 may contain a substantially transparent material with electrical conductivity so as to increase a transmittance of incident light. More specifically, the first electrode 110 may be formed of a material having high transmittance and high electrical conductivity, so as to transmit most of incident light and allow electricity to flow therein. For example, the first electrode 110 may be formed of at least one selected from the group consisting of indium tin oxide (ITO), tin-based oxide (for example, $SnO_2$), AgO, $ZnO-Ga_2O_3$ (or $ZnO-Al_2O_3$), fluorine tin oxide (FTO), and a combination thereof. A specific resistance of the first electrode 110 may be about $10^{-2}$ Ω·cm to $10^{-11}$ Ω·cm.

The first electrode 110 may be electrically connected to the photoelectric conversion unit PV. Hence, the first electrode 110 may collect carriers (for example, holes) produced by the incident light and may output the carriers.

A plurality of uneven portions may be formed on an upper surface of the first electrode 110, and the uneven portions may have a non-uniform pyramid structure. In other words, the first electrode 110 may have a textured surface. As described above, when the surface of the first electrode 110 is textured, the first electrode 110 may reduce a reflectance of incident light and increase an absorptance of incident light. Hence, the efficiency of the thin film solar cell module may be improved.

Although FIG. 3 shows only the uneven portions of the first electrode 110, the photoelectric conversion unit PV may have a plurality of uneven portions among various layers and/or surfaces. In the embodiment of the invention, for example, only the uneven portions of the first electrode 110 are described below for the sake of brevity.

The second electrode 140 may be formed of a metal material with good electrical conductivity so as to increase a recovery efficiency of electric power produced by the photoelectric conversion unit PV. The second electrode 140 electrically connected to the photoelectric conversion unit PV may collect carriers (for example, electrons) produced by incident light and may output the carriers.

The photoelectric conversion unit PV is positioned between the first electrode 110 and the second electrode 140 and produces the electric power using light incident thereon from the outside.

The photoelectric conversion unit PV may have the p-i-n structure including a p-type semiconductor layer PV-p, an intrinsic (called i-type) semiconductor layer PV-i, and an n-type semiconductor layer PV-n which are sequentially formed on the incident surface of the substrate 100 in the order named. Other layers may be included or present in the photoelectric conversion unit PV.

The p-type semiconductor layer PV-p may be formed using a gas obtained by adding impurities of a group III element, such as boron (B), gallium (Ga), and indium (In), to a raw gas containing silicon (Si).

The i-type semiconductor layer PV-i may prevent or reduce a recombination of carriers and may absorb light. The i-type semiconductor layer PV-i may absorb incident light to produce carriers such as electrons and holes.

The i-type semiconductor layer PV-i may contain microcrystalline silicon (mc-Si), for example, hydrogenated microcrystalline silicon (mc-Si:H). Alternatively, the i-type semiconductor layer PV-i may contain amorphous silicon (a-Si), for example, hydrogenated amorphous silicon (a-Si:H).

The n-type semiconductor layer PV-n may be formed using a gas obtained by adding impurities of a group V element, such as phosphorus (P), arsenic (As), and antimony (Sb), to a raw gas containing silicon (Si).

The photoelectric conversion unit PV may be formed using a chemical vapor deposition (CVD) method, such as a plasma enhanced CVD (PECVD) method.

In the photoelectric conversion unit PV, the p-type semiconductor layer PV-p and the n-type semiconductor layer PV-n may form a p-n junction with the i-type semiconductor layer PV-i interposed therebetween. In other words, the i-type semiconductor layer PV-i may be positioned between the p-type semiconductor layer PV-p (i.e., a p-type doped layer) and the n-type semiconductor layer PV-n (i.e., an n-type doped layer).

In such a structure of the solar cell illustrated in FIG. 3, when light is incident on the p-type semiconductor layer PV-p, a depletion region is formed inside the i-type semiconductor layer PV-i because of the p-type semiconductor layer Pv-p and the n-type semiconductor layer PV-n each having a relatively high doping concentration, thereby generating an electric field. Electrons and holes, which are produced in the i-type semiconductor layer PV-i corresponding to a light absorbing layer by a photovoltaic effect, are separated from each other by a contact potential difference and move in different directions. For example, the holes may move to the first electrode 110 through the p-type semiconductor layer PV-p, and the electrons may move to the second electrode 140 through the n-type semiconductor layer PV-n. Hence, the electric power may be produced when the semiconductor layers PV-p and PV-n are respectively connected using external wires, for example.

Alternatively, as shown in FIG. 4, the solar cell of the thin film solar cell module according to the embodiment of the invention may have a double junction structure or a p-i-n/p-i-n structure.

In the following description, similar descriptions of the configuration and the structure as previously described above may be briefly made or may be entirely omitted.

As shown in FIG. 4, the photoelectric conversion unit PV of the double junction solar cell may include a first photoelectric conversion unit PV1 and a second photoelectric conversion unit PV2.

More specifically, a first p-type semiconductor layer PV1-p, a first i-type semiconductor layer PV1-i, a first n-type semiconductor layer PV1-n, a second p-type semiconductor layer PV2-p, a second i-type semiconductor layer PV2-i, and a second n-type semiconductor layer PV2-n may be sequentially stacked on the incident surface of the substrate 100 in the order named. Other layers may be included or present in the photoelectric conversion unit PV.

The first i-type semiconductor layer PV1-i may mainly absorb light of a short wavelength band to produce electrons and holes. The second i-type semiconductor layer PV2-i may mainly absorb light of a long wavelength band to produce electrons and holes.

As described above, because the double junction solar cell absorbs light of the short wavelength band and light of the long wavelength band to produce carriers, the efficiency of the thin film solar cell module can be improved.

A thickness of the second i-type semiconductor layer PV2-i may be greater than a thickness of the first i-type semiconductor layer PV1-i, so as to sufficiently absorb light of the long wavelength band.

In the photoelectric conversion unit PV shown in FIG. 4, the first i-type semiconductor layer PV1-i of the first photoelectric conversion unit PV1 and the second i-type semiconductor layer PV2-i of the second photoelectric conversion unit PV2 may contain amorphous silicon. Alternatively, the first i-type semiconductor layer PV1-i of the first photoelectric conversion unit PV1 may contain amorphous silicon, and the second i-type semiconductor layer PV2-i of the second photoelectric conversion unit PV2 may contain microcrystal line silicon.

Further, in the photoelectric conversion unit PV shown in FIG. 4, the second i-type semiconductor layer PV2-i of the second photoelectric conversion unit PV2 may be doped with germanium (Ge) as impurities. Because germanium (Ge) may reduce a band gap of the second i-type semiconductor layer PV2-i, an absorptance of the second i-type semiconductor layer. PV2-i with respect to light of the long wavelength band may increase, Hence, the efficiency of the thin film solar cell module may be improved.

In other words, in the double junction solar cell, the first i-type semiconductor layer PV1-i may absorb light of the short wavelength band to provide the photoelectric effect, and the second i-type semiconductor layer PV2-i may absorb light of the long wavelength band to provide the photoelectric effect. Further, because the band gap of the second i-type semiconductor layer PV2-i doped with Ge is further reduced, the second i-type semiconductor layer PV2-i may absorb a large amount of light of the long wavelength band. As a result, the efficiency of the thin film solar cell module may be improved.

The PECVD method may be used to dope the second i-type semiconductor layer PV2-$i$ with Ge. In the PECVD method, a very high frequency (VHF), a high frequency (HF), or a radio frequency (RF) may be applied to a chamber filled with Ge gas.

In the embodiment of the invention, an amount of Ge contained in the second i-type semiconductor layer PV2-$i$ may be about 3 to 20 atom %. When the amount of Ge is within the above range, the band gap of the second i-type semiconductor layer PV2-$i$ may be sufficiently reduced. Hence, the absorptance of the second i-type semiconductor layer PV2-$i$ with respect to light of the long wavelength band may increase.

Even in this instance, the first i-type semiconductor layer PV1-$i$ may mainly absorb light of the short wavelength band to produce electrons and holes. The second i-type semiconductor layer PV2-$i$ may mainly absorb light of the long wavelength band to produce electrons and holes. Further, the thickness of the second i-type semiconductor layer PV2-$i$ may be greater than the thickness of the first i-type semiconductor layer PV1-$i$, so as to sufficiently absorb light of the long wavelength band.

Alternatively, as shown in FIG. 5, the solar cell of the thin film solar cell module according to the embodiment of the invention may have a triple junction structure or a p-i-n/p-i-n/p-i-n structure. In the following, description, similar descriptions of the configuration and the structure as previously described above may be briefly made or may be entirely omitted.

As shown in FIG. 5, the photoelectric conversion unit PV of the triple junction solar cell may include a first photoelectric conversion unit PV1, a second photoelectric conversion unit PV2, and a third photoelectric conversion unit PV3 that are sequentially positioned on the incident surface of the substrate 100 in the order named. Other layers may be included or present in the first, second and/or third photoelectric conversion units or therebetween.

Each of the first photoelectric conversion unit PV1, the second photoelectric conversion unit PV2, and the third photoelectric conversion unit PV3 may have the p-i-n structure in the embodiment of the invention. A first p-type semiconductor layer PV1-$p$, a first i-type semiconductor layer PV1-$i$, a first n-type semiconductor layer PV1-$n$, a second p-type semiconductor layer PV2-$p$, a second i-type semiconductor layer PV2-$i$, a second n-type semiconductor layer PV2-$n$, a third p-type semiconductor layer PV3-$p$, a third i-type semiconductor layer PV3-$i$, and a third n-type semiconductor layer PV3-$n$ may be sequentially positioned on the substrate 100 in the order named. Other layers may be included or present in the first, second, and/or third photoelectric conversion units or therebetween.

The first i-type semiconductor layer PV1-$i$, the second i-type semiconductor layer PV2-$i$, and the third i-type semiconductor layer PV3-$i$ may be variously implemented.

As a first example, the first i-type semiconductor layer PV1-$i$ and the second i-type semiconductor layer PV2-$i$ may contain amorphous silicon (a-Si), and the third i-type semiconductor layer PV3-$i$ may contain microcrystalline silicon (mc-Si). A band gap of the second i-type semiconductor layer PV2-$i$ may be reduced by doping the second i-type semiconductor layer PV2-$i$ with Ge as impurities.

As a second example, the first i-type semiconductor layer PV1-$i$ may contain amorphous silicon (a-Si), and the second i-type semiconductor, layer, PV2-$i$ and the third i-type semiconductor layer PV3-$i$ may contain microcrystalline silicon (mc-Si). A band gap of the third i-type semiconductor layer PV3-$i$ may be reduced by doping the third i-type semiconductor layer PV3-$i$ with Ge as impurities.

The first photoelectric conversion unit PV1 may absorb light of a short wavelength band, thereby producing electric power. The second photoelectric conversion unit PV2 may absorb light of a middle wavelength band between a short wavelength band and a long wavelength band, thereby producing electric power. The third photoelectric conversion unit PV3 may absorb light of a long wavelength band, thereby producing electric power.

A thickness of the third i-type semiconductor layer PV3-$i$ may be greater than a thickness of the second i-type semiconductor layer PV2-$i$, and the thickness of the second i-type semiconductor layer PV2-$i$ may be greater than a thickness of the first i-type semiconductor layer PV1-$i$.

Because the triple junction solar cell shown in FIG. 5 may absorb light of a wider band, the production efficiency of the electric power of the thin film solar cell module may be improved.

Figure 6:
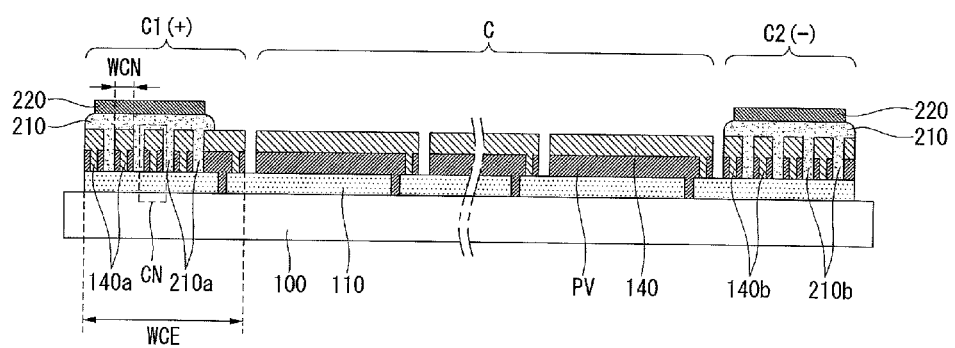
FIG. 6 illustrates an example where a first connector and a second connector are applied to both outermost solar cells of a thin film solar cell module.

FIG. 6 illustrates an example where a first connector and a second connector are applied to both outermost solar cells of the thin film solar cell module.

So far, FIGS. 2A and 2B illustrate an example where both the first and second connectors 210$a$ and 140$a$ are formed only in the first outermost solar cell C1 among the first and second outermost solar cells C1 and C2. However, as shown in FIG. 6, both the first and second connectors may be formed in the second outermost solar cell C2 as well as the first outermost solar cell C1.

As shown in FIG. 6, when both first and second connectors 210$b$ and 140$b$ are formed in the second outermost solar cell C2 in the same manner as the first outermost solar cell C1, the photoelectric conversion efficiency of the thin film solar cell module may be slightly reduced because the second outermost solar cell C2 cannot produce electric current. However, a contact resistance between the conductive adhesive part 210 and the first electrode 110 of the second outermost solar cell C2, and a contact resistance between the conductive adhesive part 210 and the second electrode 140 of the second outermost solar cell C2 may be greatly reduced through the first and second connectors 210$b$ and 140$b$.

Accordingly, because generation of heat resulting from the contact resistance between the conductive adhesive part 210 and the second outermost solar cell C2 is prevented or reduced in the same manner as the description of the first outermost solar cell C1 with reference to FIGS. 2A and 2B, life span of the thin film solar cell module 10 may increase.

More specifically, in the thin film solar cell module 10 according to the embodiment of the invention, the contact resistance between the conductive adhesive part 210 and the first outermost solar cell C1 and the contact resistance between the conductive adhesive part 210 and the second outermost solar cell C2 may be reduced as indicated by the following Table 1.

TABLE 1

|  | Serial resistance of first outermost solar cell | Serial resistance of second outermost solar cell |
| --- | --- | --- |
| Comparative example | 20.81 mΩ | 20.93 mΩ |
| Embodiment of the invention | 19.72 mΩ | 19.83 mΩ |

In the above Table 1, serial resistances between the first and second outermost solar cells C1 and C2 and the conductive adhesive part 210 in the embodiment of the invention, in which the first and second connectors are formed in each of the first and second outermost solar cells C1 and C2, was less than a comparative example, in which the first and second connectors are not formed in each of the first and second outermost solar cells C1 and C2, by about 1.1 mΩ (i.e., about 5%).

A temperature difference between each of the first and second outermost solar cells C1 and C2 and the center solar cell C was reduced because of a reduction in the contact resistance, as indicated by the following Table 2.

TABLE 2

|  | First outermost solar cell (° C.) | Center solar cell (° C.) | Second outermost solar cell (° C.) |
|---|---|---|---|
| Comparative example | 59.5° C. | 49.9° C. | 57.6° C. |
| Embodiment of the invention | 54.8° C. | 49.7° C. | 52.2° C. |

As indicated by the above Table 2, in the comparative example, in which the first and second connectors are not formed in each of the first and second outermost solar cells C1 and C2, the temperature difference between each of the first and second outermost solar cells C1 and C2 and the center solar cell C was about 8° C. to 10° C. On the other hand, in the embodiment of the invention, in which the first and second connectors are formed in each of the first and second outermost solar cells C1 and C2, the temperature difference between each of the first and second outermost solar cells C1 and C2 and the center solar cell C was greatly reduced and was about 3° C. to 5° C.

The life span of the thin film solar cell module 10 according to the embodiment of the invention may increase through a reduction in the temperature difference between each of the first and second outermost solar cells C1 and C2 and the center solar cell C.

In the thin film solar cell module 10 according to the embodiment of the invention, the number of non-power generation cells CN included in each of the first and second outermost solar cells C1 and C2 may be four, for example, in FIG. 6. The number of non-power generation cells CN may vary depending on the quality of the thin film solar cell module 10, i.e., the quality of the deposited thin film.

Unlike FIG. 6, the optimum number of non-power generation cells CN included in each of the first and second outermost solar cells C1 and C2 may be two or three.

Further, a width of each of the non-power generation cells CN may vary depending on the number of non-power generation cells CN included in each of the first and second outermost solar cells C1 and C2.

For example, as described above, when each of the first and second outermost solar cells C1 and C2 includes the three or four non-power generation cells CN, a width WCN of each non-power generation cell CN may be about ⅕ to ⅓ of a width WCE of each of the first and second outermost solar cells C1 and C2.

In the embodiment of the invention, other widths and other numbers may be used for non-power generation cells CN.

Figure 7:
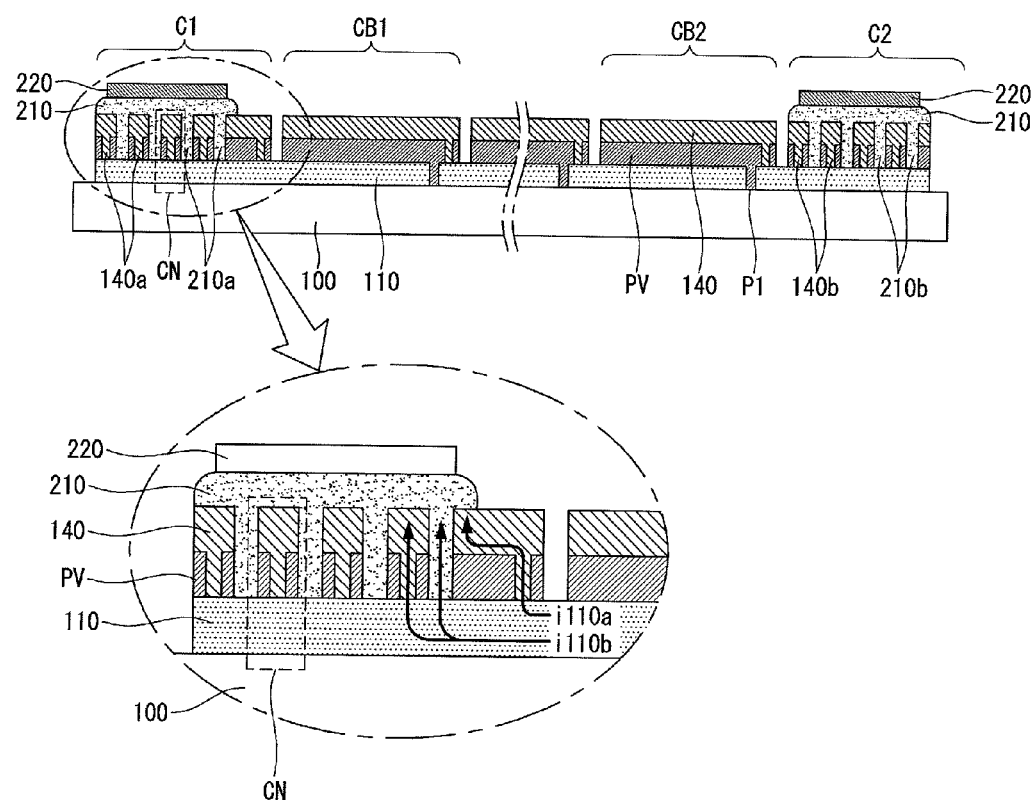
FIG. 7 illustrates an example where a first electrode included in one of outermost solar cells of a thin film solar cell module is electrically connected to a first electrode included in a solar cell directly adjacent to the one outermost solar cell.

FIG. 7 illustrates an example where the first electrode included in one of the outermost solar cells of the thin film solar cell module is electrically connected to the first electrode included in a solar cell directly adjacent to the one outermost solar cell.

In the thin film solar cell module according to the embodiment of the invention, the first electrode 110 included in one of the outermost solar cells may be electrically connected to the first electrode 110 included in a solar cell directly adjacent to the one outermost solar cell.

For example, as shown in FIG. 7, the first electrode 110 included in the first outermost solar cell C1 may be electrically connected to the first electrode 110 included in a solar cell directly adjacent to the first outermost solar cell C1. Further, the first electrode 110 included in the second outermost solar cell C2 may not be electrically connected to the first electrode 110 included in a solar cell directly adjacent to the second outermost solar cell C2 by the first scribing line P1 in the same manner as a general case.

As described above, the electrical connection between the first electrode 110 of one outermost solar cell and the first electrode 110 of a solar cell directly adjacent to the one outermost solar cell is determined based on an electrical connection relationship between the one outermost solar cell and the directly adjacent solar cell.

More specifically, as shown in FIG. 7, a solar cell CB1 (hereinafter, referred to as "first adjacent cell") directly adjacent to the first outermost solar cell C1 is connected in series to the first outermost solar cell C1 through a first electrode 110 of the first adjacent cell CB1. Therefore, even when the first electrode 110 of the first outermost solar cell C1 is electrically connected to the first electrode 110 of the first adjacent cell CB1, a serial connection structure between the first outermost solar cell C1 and the first adjacent cell CB1 is not affected.

On the other hand, a solar cell CB2 (hereinafter, referred to as "second adjacent cell") directly adjacent to the second outermost solar cell C2 is connected in series to the second outermost solar cell C2 through a second electrode 140 of the second adjacent cell CB2. Therefore, when the first electrode 110 of the second outermost solar cell C2 is electrically connected to the first electrode 110 of the second adjacent cell CB2, a serial connection structure between the second outermost solar cell C2 and the second adjacent cell CB2 may be broken. Thus, the first electrode 110 of the second outermost solar cell C2 may not be electrically connected to the first electrode 110 of the second adjacent cell CB2 by presence of the first scribing line P1 in the same manner as a general case.

A described above, when the first electrode 110 of the first outermost solar cell C1 is electrically connected to the first electrode 110 of the first adjacent cell CB1, carriers, which are produced in the first adjacent cell CB1 and are collected by the first electrode 110 of the first adjacent cell CB1, may move to the junction box 250 along both a path 'i110a' through the second electrode 140 of the first outermost solar cell C1 and a path 'i110b' through the first and second connectors 210a and 140a.

Hence, the various moving paths of the carriers may be secured. In other words, the temperature of heat generated when the carriers move along one moving path may be reduced through the various moving paths.

FIG. 7 illustrates that the first and second connectors 210b and 140b are formed in the second outermost solar cell C2. When the first and second connectors 210b and 140b are not formed in the second outermost solar cell C2, the first electrode 110 of the first outermost solar cell C1 may be electrically connected to the first electrode 110 of the first adjacent cell CB1.

Figure 8:
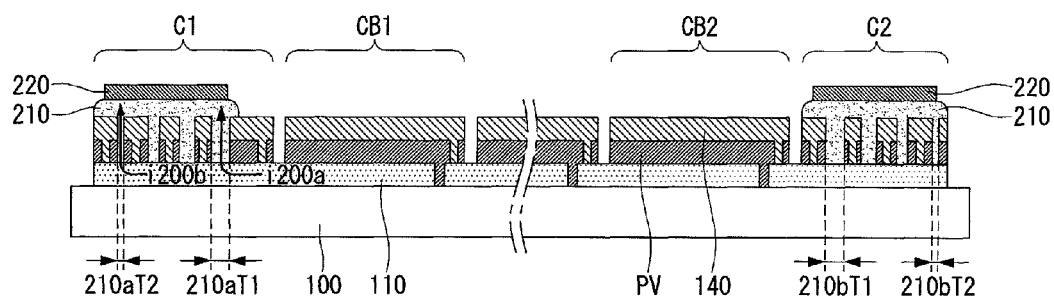
FIG. 8 illustrates an example where first connectors included in an outermost solar cell have different widths.

FIG. 8 illustrates an example where the first connectors included in the outermost solar cell have different widths.

In the thin film solar cell module according to the embodiment of the invention, widths of the plurality of first connectors 210a of the outermost solar cell may be different from each other. For example, the widths of the first connectors 210a may increase as a distance between the outermost solar cell and a solar cell directly adjacent to the outermost solar cell shortens.

More specifically, as shown in FIG. 8, a width 210aT1 of the first connector 210a of the first outermost solar cell C1 closest to the first adjacent cell CB1 may be greater than a width 210aT2 of the first connector 210a farthest from the first adjacent cell CB1. The widths of the first connectors 210a of the first outermost solar cell C1 may increase as the first connectors 210a are closer to the first adjacent cell CB1.

Further, widths 210bT1 and 210bT2 of the plurality of first connectors 210b of the second outermost solar cell C2 may increase as a distance between the first connector 210b and the second adjacent cell CB2 shortens.

More specifically, as shown in FIG. 8, when the first and second connectors 210b and 140b are formed in the second outermost solar cell C2, the width 210bT1 of the first connector 210b of the second outermost solar cell C2 closest to the second adjacent cell CB2 may be greater than the width 210bT2 of the first connector 210b farthest from the second adjacent cell CB2 in the same manner as the first connectors 210a of the first outermost solar cell C1.

Hence, a resistance of a shortest path i200a of carriers (for example, holes or electrons) produced in the solar cell adjacent to the outermost solar cell, which move to the junction box 250 through the plurality of first connectors 210a, may be reduced. As a result, the efficiency of the thin film solar cell module may be further improved.

The width of each of the first connectors 210a may be about 40 μm to 150 μm.

FIG. 8 illustrates that the first and second connectors 210b and 140b are formed in the second outermost solar cell C2. However, the configuration of the first connectors 210a illustrated in FIG. 9 may also be applied to a configuration in which the first and second connectors 210b and 140b are not formed in the second outermost solar cell C2.

Figure 9:
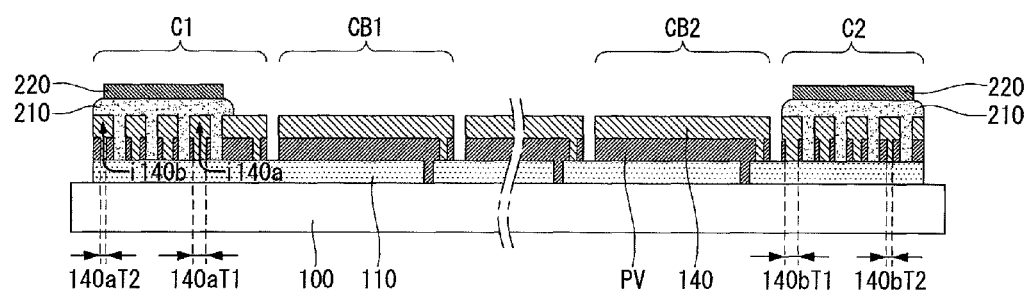
FIG. 9 illustrates an example where second connectors included in an outermost solar cell have different widths.

FIG. 9 illustrates an example where second connectors included in an outermost solar cell have different widths.

In the thin film solar cell module according to the embodiment of the invention, widths of the plurality of second connectors 140a of the outermost solar cell may be different from each other. For example, the widths of the second connectors 140a may increase as a distance between the outermost solar cell and a solar cell directly adjacent to the outermost solar cell shortens.

More specifically, as shown in FIG. 9, a width 140aT1 of the second connector 140a of the first outermost solar cell C1 closest to the first adjacent cell CB1 may be greater than a width 140aT2 of the second connector 140a farthest from the first adjacent cell CB1. The widths of the second connectors 140a of the first outermost solar cell C1 may increase as the second connectors 140a are closer to the first adjacent cell CB1.

Further, widths of the plurality of second connectors 140a of the second outermost solar cell C2 may increase as the second connectors 140a are closer to the second adjacent cell CB2.

More specifically, as shown in FIG. 9, when the first and second connectors 210b and 140b are formed in the second outermost solar cell C2, a width 140bT1 of the second connector 140b of the second outermost solar cell C2 closest to the second adjacent cell CB2 may be greater than a width 140bT2 of the second connector 140b farthest from the second adjacent cell CB2 in the same manner as the second connectors 140a of the first outermost solar cell C1.

Hence, a resistance of a shortest path i140a of carriers (for example, holes or electrons) produced in the first adjacent cell CB1, which move to the junction box 250 through the plurality of second connectors 140a, may be reduced. As a result, the efficiency of the thin film solar cell module may be further improved.

The width of each of the second connectors 140a may be about 40 μm to 150 μm.

FIG. 9 illustrates that the first and second connectors 210b and 140b are formed in the second outermost solar cell C2. However, the configuration of the second connectors 140a illustrated in FIG. 9 may also be applied to a configuration in which the first and second connectors 210b and 140b are not formed in the second outermost solar cell C2.

As described above, the thin film solar cell module according to the embodiment of the invention reduces the contact resistance between the conductive adhesive parts 210 and the outermost solar cells C1 and C2, thereby reducing heat generated in a contact portion between the conductive adhesive parts 210 and the outermost solar cells C1 and C2.

So far, the embodiment of the invention described that the photoelectric conversion unit of the thin film solar cell module contains silicon. However, the configuration of the photoelectric conversion unit according to the embodiment of the invention may be applied to the photoelectric conversion unit containing material other than silicon, for example, CdTe (cadmium telluride), CIGS (copper indium gallium selenide), or cadmium sulfide (CdS).

So far, the structure of the thin film solar cell module according to the embodiment of the invention was described. A method for manufacturing the thin film solar cell module according to the embodiment of the invention is described in detail below.

FIGS. 10A to 10K illustrate a method for manufacturing a thin film solar cell module according to an example embodiment of the invention. More specifically, FIGS. 10A to 10K illustrate a method for manufacturing the thin film solar cell module shown in FIG. 6.

Figure 10A:
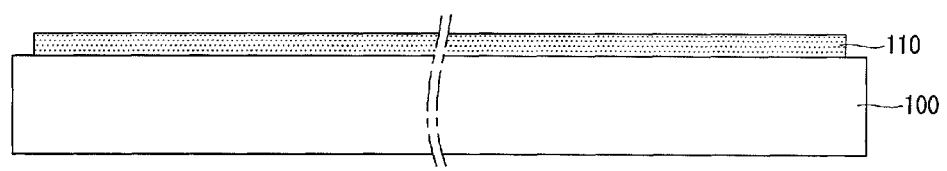
FIGS. 10A to 10K illustrate a method for manufacturing a thin film solar cell module according to an example embodiment of the invention.

As shown in FIG. 10A, a first electrode 110 (or a first electrode layer) is entirely formed (or almost entirely formed) on a substrate 100. In this instance, the first electrode 110 may be formed through deposition on the substrate 100 using a CVD device or a PECVD device.

Figure 10B:
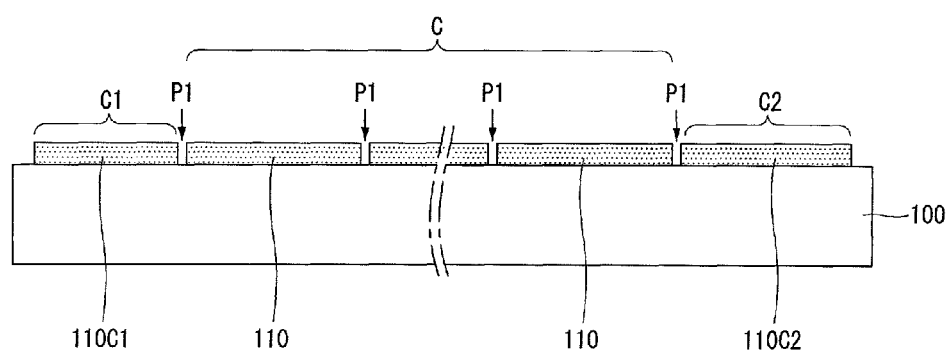

Next, as shown in FIG. 10B, a laser beam is irradiated onto the first electrode 110 to remove a portion of the first electrode 110. Hence, a pattern of a first scribing line P1 is formed on the first electrode 110, and a plurality of first electrodes 110 are formed. In this instance, a width of the removed portion of the first electrode 110 removed by the laser beam may be about 30 μm to 70 μm. Other widths may be used. In embodiments of the invention, the first scribing line P1 need not be formed by a laser beam, but may be formed by other removal methods.

The first electrodes 110 respectively included in the plurality of solar cells are distinguished from one another by the pattern of the first scribing line P1. Thus, first electrodes 110C1, 110C2 positioned at both ends of the substrate 100 are respectively included in first and second outermost solar cells C1 and C2.

Figure 10C:
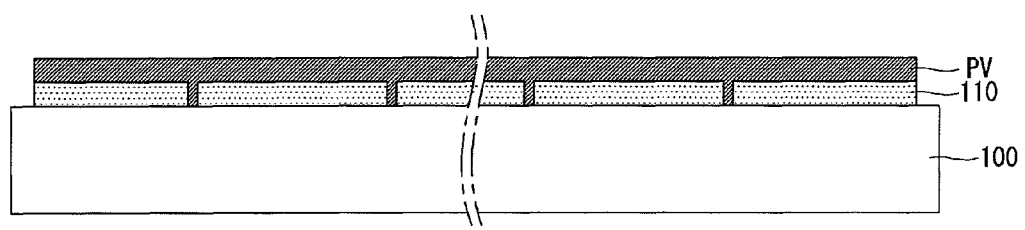

Next, as shown in FIG. 10C, a photoelectric conversion unit PV (or a photoelectric conversion unit layer) is formed on an entire upper surface of the first electrode 110. In this instance, the photoelectric conversion unit PV may be deposited on the upper surface of the substrate 100 partially (or locally) exposed by the pattern of the first scribing line P1 as well as the upper surface of the first electrode 110.

Figure 10D:
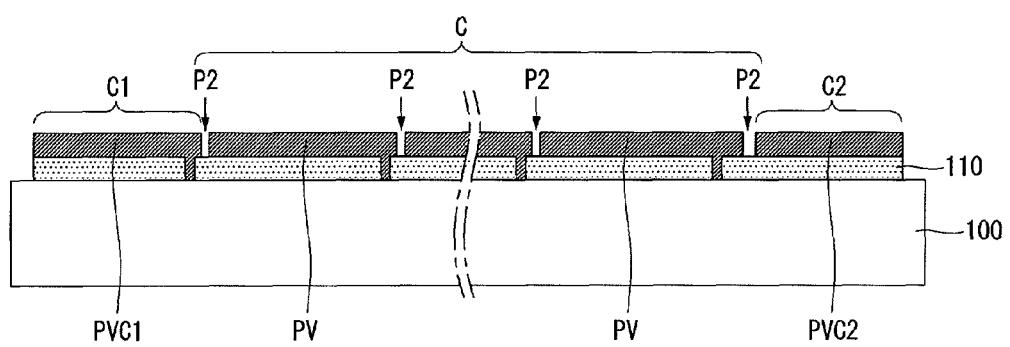

Next, as shown in FIG. 10D, the laser beam is irradiated onto the photoelectric conversion unit PV to remove a portion of the photoelectric conversion unit PV. Hence, a pattern of a second scribing line P2 is formed on the photoelectric conversion unit PV, and a plurality of photoelectric conversion units PV are formed.

The photoelectric conversion units PV respectively included in the plurality of solar cells are distinguished from one another by the pattern of the second scribing line P2. Further, the first electrode 110 is partially (or locally) exposed by the pattern of the second scribing line P2.

Thus, photoelectric conversion units PVC1 and PVC2 positioned at both ends of the substrate 100 are respectively included in the first and second outermost solar cells C1 and C2.

Figure 10E:
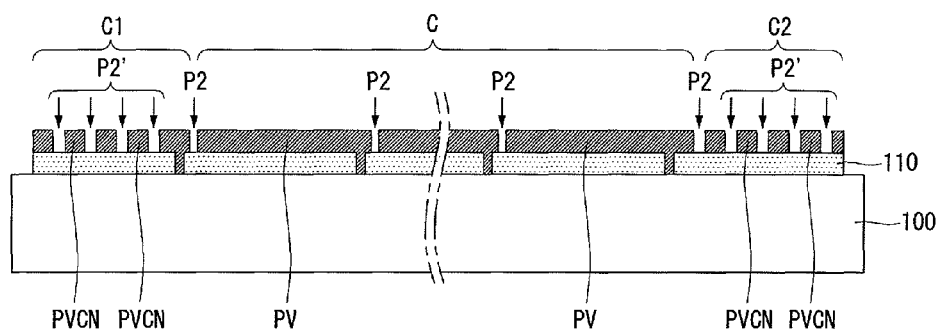

Next, as shown in FIG. 10E, a pattern of a separate second scribing line P2' is additionally formed on the photoelectric conversion units PVC1 and PVC2 of the first and second outermost solar cells C1 and C2.

Each of the photoelectric conversion units PVC1 and PVC2 of the first and second outermost solar cells C1 and C2 is divided into a plurality of photoelectric conversion units PVCN respectively included in a plurality of non-power generation cells CN by the pattern of the separate second scribing line P2'. Further, the first electrodes 110 of the first and second outermost solar cells C1 and C2 are partially (or locally) exposed by the pattern of the separate second scribing line P2'.

In the embodiment of the invention, after the pattern of the second scribing line P2 shown in FIG. 10D is formed, the pattern of the separate second scribing line P2' shown in FIG. 10E is formed. However, the embodiment of the invention is not limited thereto. For example, after the pattern of the separate second scribing line P2' formed, the pattern of the second scribing line P2 may be formed. Alternatively, the formation of the pattern of the second scribing line P2 and the formation of the pattern of the separate second scribing line P2' may be mixed. In other embodiments of the invention, the formation of the pattern of the second scribing line P2 and the formation of the pattern of the separate second scribing line P2' may be simultaneous, or sequential.

Figure 10F:
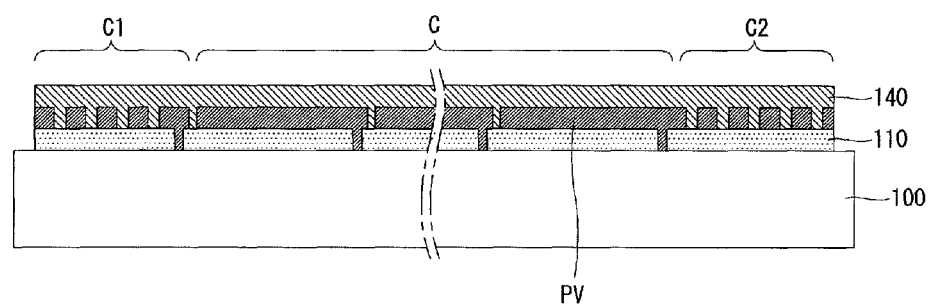

Next, as shown in FIG. 10F, a second electrode 140 (or a second electrode layer) is deposited on the exposed portions of the first electrodes 110 and the photoelectric conversion units PV and PVCN of the plurality of solar cells.

Hence, the first electrode 110 of each of the solar cells C partially (or locally) exposed by the pattern of the second scribing line P2 directly contacts the second electrode 140, and thus, is electrically connected to the second electrode 140 of each center solar cell C.

Further, the first electrode 110 of each of the first and second outermost solar cells C1 and C2 partially (or locally) exposed by the pattern of the separate second scribing line P2' directly contacts the second electrode 140, and thus, is electrically connected to the second electrode 140. Hence, a plurality of second connectors 140a for electrically connecting the first electrode 110 to the second electrode 140 are formed in each of the first and second outermost solar cells C1 and C2.

Figure 10G:
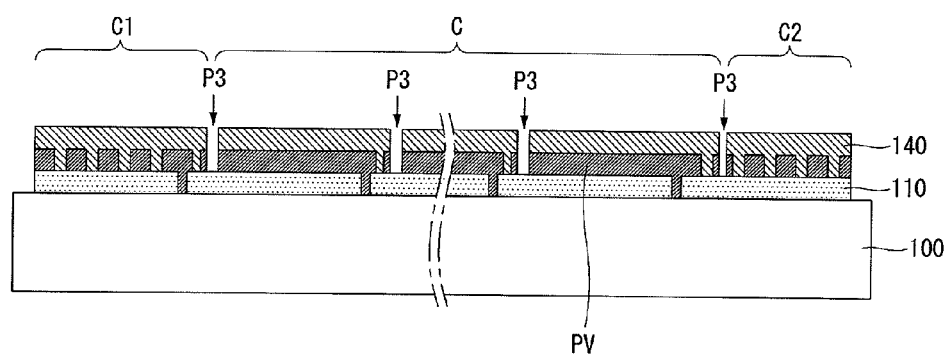

Next, as shown in FIG. 10G, a pattern of a third scribing line P3 is formed using the laser beam. Each of the second electrode 140 and the photoelectric conversion unit PV is divided into a plurality of parts by the pattern of the third scribing line P3. A plurality of second electrodes 140 are formed thereby. Hence, the form of the plurality of solar cells is completed. In embodiments of the invention, the third scribing line P3 need not be formed by a laser beam, but may be formed by other removal methods.

In each of the plurality of solar cells, the first electrode 110 of one solar cell is connected in series to the second electrode 140 of a solar, cell adjacent to the one solar cell.

Figure 10H:
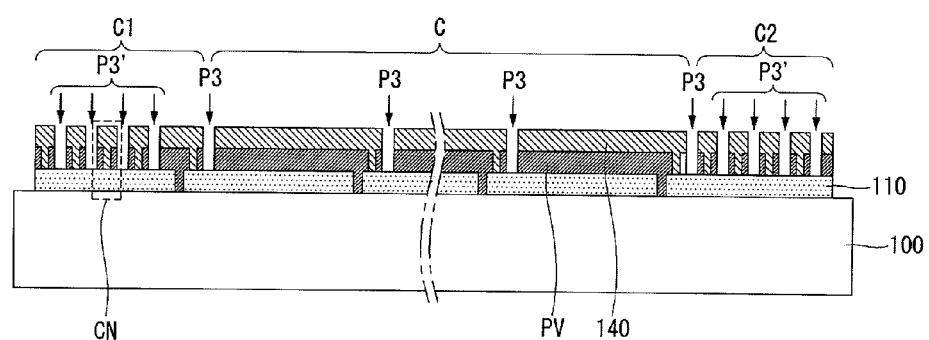

Next, as shown in FIG. 10H, a pattern of a separate third scribing line P3' is additionally formed in each of the first and second outermost solar cells C1 and C2 using the laser beam. The pattern of the separate third scribing line P3' may not overlap the pattern of the separate second scribing line P2' formed in each of the first and second outermost solar cells C1 and C2.

Hence, the first electrode 110 of each of the first and second outermost solar cells C1 and C2 is partially (or locally) exposed by the pattern of the separate third scribing line P3'.

The embodiment of the invention described that after the pattern of the third scribing line P3 shown in FIG. 10G is formed, the pattern of the separate third scribing line P3' shown in FIG. 10H is formed. However, the embodiment of the invention is not limited thereto. For example, after the pattern of the separate third scribing line P3' is formed, the pattern of the third scribing line P3 may be formed. Alternatively, the formation of the pattern of the third scribing line P3 and the formation of the pattern of the separate third scribing line P3' may be mixed. In other embodiments of the invention, the formation of the pattern of the third scribing line P3 and the formation of the pattern of the separate third scribing line P3' may be simultaneous, or sequential.

Figure 10I:
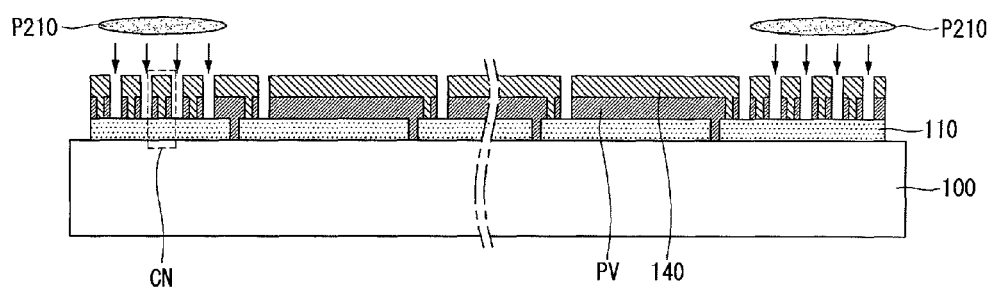

Next, as shown in FIG. 10I, a paste P210 containing a metal material with electrical conductivity is coated on each of the first and second outermost solar cells C1 and C2 to form a conductive adhesive part 210.

As described above, when the paste P210 containing the metal material with electrical conductivity is coated on each of the first and second outermost solar cells C1 and C2, the paste P210 flows into a space formed by the pattern of the separate third scribing line P3' and is directly connected to the exposed portion of the first electrode 110 of each of the first and second outermost solar cells C1 and C2.

Figure 10J:
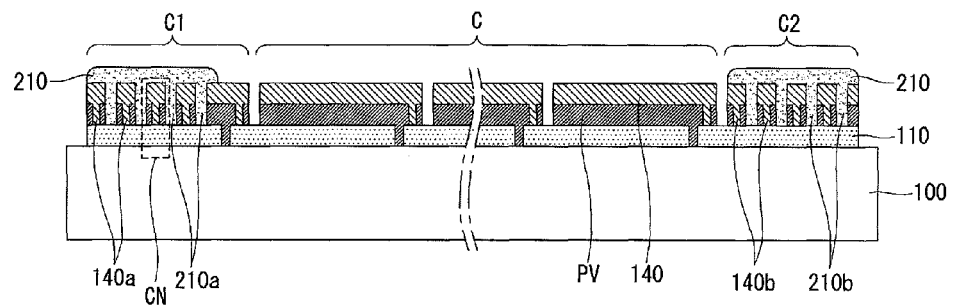

Next, as shown in FIG. 10J, when the paste P210 is dried, the conductive adhesive part 210 is formed on each of the first and second outermost solar cells C1 and C2. Further, the conductive adhesive part 210 includes a first connector 210a which is directly connected to the first electrode 110 of each of the first and second outermost solar cells C1 and C2.

Figure 10K:
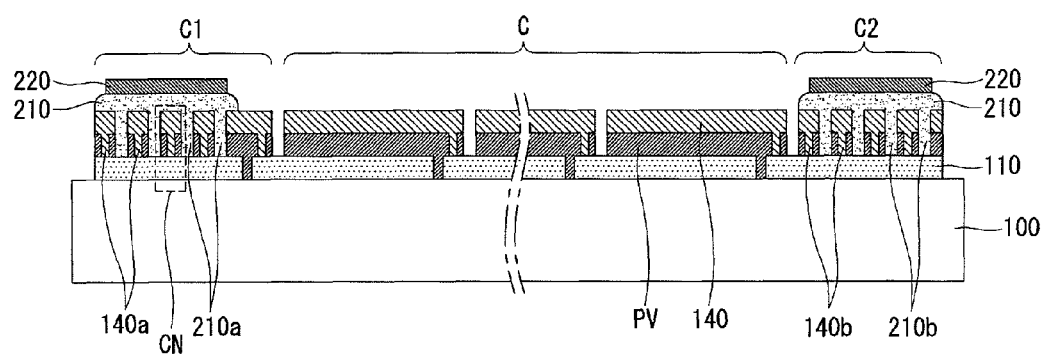

Next, as shown in FIG. 10K, a ribbon 220 is formed on each of the first and second outermost solar cells C1 and C2, on which the conductive adhesive part 210 is formed.

Hence, the thin film solar cell module shown in FIG. 6 may be completed.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film solar cell module comprising:
a substrate;
a plurality of solar cells each including a first electrode positioned on the substrate, a second electrode positioned on the first electrode, and a photoelectric conversion unit positioned between the first electrode and the second electrode;
a ribbon positioned on each of first and second outermost solar cells among the plurality of solar cells, the plurality of solar cells being electrically connected in series to one another; and
a conductive adhesive part positioned between the first outermost solar cell and the ribbon and between the second outermost solar cell and the ribbon, the conductive adhesive part electrically connecting each of the first and second outermost solar cells to the ribbon,
wherein the conductive adhesive part positioned between the second electrode of the first outermost solar cell and the ribbon includes a plurality of first connectors, which are electrically connected to the first electrode, the photoelectric conversion unit, and the second electrode included in the first outermost solar cell,
wherein the second electrode of the first outermost solar cell includes a plurality of second connectors, which are electrically connected to the first electrode of the first outermost solar cell,
wherein the first outermost solar cell is the outermost solar cell on a first end of a string of the plurality of solar cells and the second outermost solar cell is the outermost solar cell on a second end of same string of the plurality of solar cells,
wherein each portion of the second electrode of the first outermost solar cell includes a respective second connector,
wherein the plurality of first connectors have different widths and wherein the plurality of second connectors have different widths,
wherein widths of the plurality of first connectors increase as the plurality of first connectors are closer to a solar cell directly adjacent to the first outermost solar cell, and
wherein widths of the plurality of second connectors increase as the plurality of second connectors are closer to the solar cell directly adjacent to the first outermost solar cell.

2. The thin film solar cell module of claim 1, wherein the first electrode of the first outermost solar cell is integrally formed along with a first electrode of the solar cell directly adjacent to the first outermost solar cell.

3. The thin film solar cell module of claim 1, wherein the widths of each of the plurality of first connectors and the plurality of second connectors are about 40 μm to 150 μm.

4. The thin film solar cell module of claim 1, wherein the conductive adhesive part contains a metal material.

5. The thin film solar cell module of claim 1, further comprising:
a junction box configured to collect electric power produced by the plurality of solar cells; and
a bus bar electrode which is positioned across upper parts of the plurality of solar cells and connects the junction box to the ribbon.

6. The thin film solar cell module of claim 5, further comprising an insulating part which is positioned between the plurality of solar cells and the bus bar electrode, and is formed of a non-conductive material.

7. The thin film solar cell module of claim 1, wherein the photoelectric conversion unit includes at least one layer having a p-i-n structure.

8. The thin film solar cell module of claim 1, wherein the conductive adhesive part positioned between the second electrode of the second outermost solar cell and the ribbon is only directly physically connected to the second electrode of the second outermost solar cell, and is not directly physically connected to either the first electrode or the photoelectric conversion unit of the second outermost solar cell.

9. The thin film solar cell module of claim 8, wherein the second electrode of the first outermost solar cell is electrically connected to a first electrode of the solar cell directly adjacent to the first outermost solar cell, and
wherein the first electrode of the second outermost solar cell is electrically connected to a second electrode of a solar cell directly adjacent to the second outermost solar cell.

10. The thin film solar cell module of claim 1, wherein the conductive adhesive part positioned between the second electrode of the first outermost solar cell and the ribbon contacts an upper surface and a lateral surface of the second electrode of the first outermost solar cell.

11. The thin film solar cell module of claim 1, wherein the conductive adhesive part positioned between the second electrode of the first outermost solar cell and the ribbon contacts a lateral surface of the photoelectric conversion unit of the first outermost solar cell.

12. The thin film solar cell module of claim 1, wherein the conductive adhesive part positioned between the second electrode of the first outermost solar cell and the ribbon contacts a portion of an upper surface of the first electrode of the first outermost solar cell.

13. The thin film solar cell module of claim 1, wherein the conductive adhesive part includes an adhesive resin and a plurality of conductive particles distributed in the adhesive resin.

14. The thin film solar cell module of claim 1, wherein the plurality of second connectors are positioned between the conductive adhesive part and the first electrode of the first outermost solar cell.

15. The thin film solar cell module of claim 1, wherein the plurality of second connectors are positioned between two adjacent ones of the plurality of first connectors.

* * * * *